United States Patent
Chen et al.

(10) Patent No.: US 9,418,745 B1
(45) Date of Patent: Aug. 16, 2016

(54) REBALANCING IN TWIN CELL MEMORY SCHEMES TO ENABLE MULTIPLE WRITES

(71) Applicant: GLOBALFOUNDRIES INC., Cayman Islands (KY)

(72) Inventors: Xiang Chen, Brooklyn, NY (US); Toshiaki Kirihata, Poughkeepsie, NY (US); Derek H. Leu, Hopewell Junction, NY (US); Dan Moy, Bethel, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/661,383

(22) Filed: Mar. 18, 2015

(51) Int. Cl.
| | | |
|---|---|---|
| *G11C 16/04* | (2006.01) | |
| *G11C 16/14* | (2006.01) | |
| *G11C 16/20* | (2006.01) | |
| *G11C 16/26* | (2006.01) | |

(52) U.S. Cl.
CPC ............ *G11C 16/14* (2013.01); *G11C 16/0483* (2013.01); *G11C 16/20* (2013.01); *G11C 16/26* (2013.01)

(58) Field of Classification Search
CPC ........ G11C 16/04; G11C 16/10; G11C 16/28; G11C 16/0416; G11C 11/4094; G11C 7/12
USPC ............. 365/185.29, 185.05, 185.18, 185.21, 365/185.23, 185.24, 185.25, 185.26, 185.33
See application file for complete search history.

(56) References Cited

U.S. PATENT DOCUMENTS

| | | | |
|---|---|---|---|
| 6,272,054 B1 | 8/2001 | Barth, Jr. et al. | |
| 6,528,839 B2* | 3/2003 | Shukuri ................. | B82Y 10/00 257/314 |
| 6,563,736 B2* | 5/2003 | Hsu ..................... | G11C 16/0441 257/317 |
| 6,724,029 B2 | 4/2004 | Hsu et al. | |
| 7,177,216 B2 | 2/2007 | Suh et al. | |
| 7,375,999 B2 | 5/2008 | Vogelsang | |
| 8,477,535 B2 | 7/2013 | Kato | |
| 8,559,232 B2* | 10/2013 | Lee .................... | G11C 16/0441 365/185.25 |

* cited by examiner

*Primary Examiner* — Gene Auduong
(74) *Attorney, Agent, or Firm* — Scully Scott Murphy and Presser

(57) ABSTRACT

A system and method of operating a twin-transistor, multi-time programmable memory (MTPM) memory cell that ensures accurate reproducibility of bit values read after each of write cycle. Each multi-time programmable memory cell includes a series connection of a first transistor and a second transistor. The method includes writing, using a write circuit at select memory cell locations, initial bit values to one or more select memory cells. Then, using the write circuit, a rebalancing of a state of a parameter associated with one or more the first transistor or second transistor, at each the select memory cell, is performed. Then, an erasing cycle is performed, at each the rebalanced select memory cell, the written initial bit value. In one embodiment, the erasing cycle may first be performed prior to rebalancing. The rebalancing and erasing are to be performed prior to each bit value write cycle.

19 Claims, 11 Drawing Sheets

Read as "1" after write operation

Read as "0" after write operation

| | True | Complement | |
|---|---|---|---|
| 151 — Initial | 100mV | 100mV | |
| 153 — Initial Write 1 | 100mV | 200mV | |
| 155 — Erase 1 | 100mV | 150mV | |
| 157 — Write 1 | 100mV | 250mV | |
| 158 — Erase 1 | 100mV | 200mV | |
| 160 — Write 0 | 200mV | 200mV | *Problem |

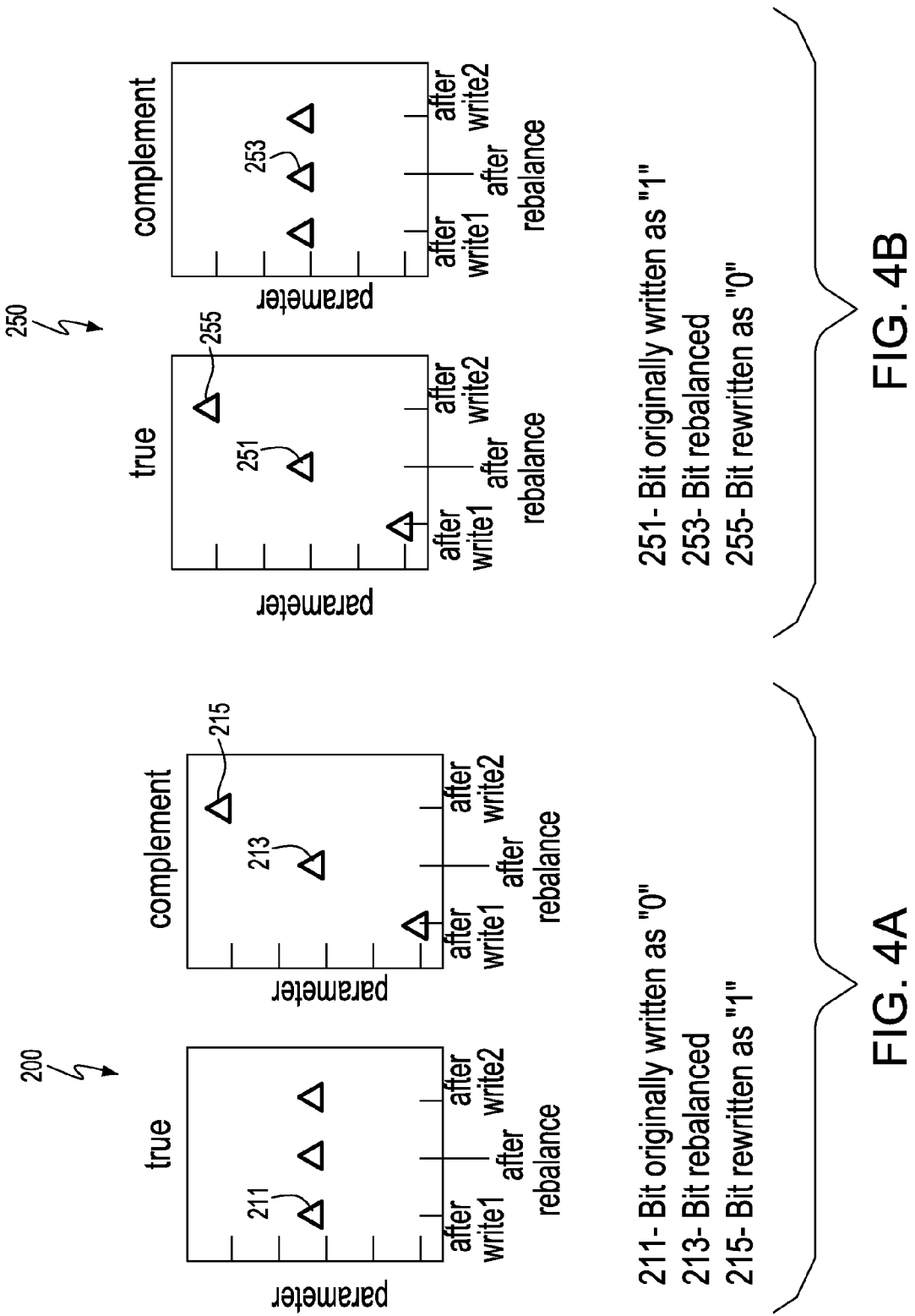

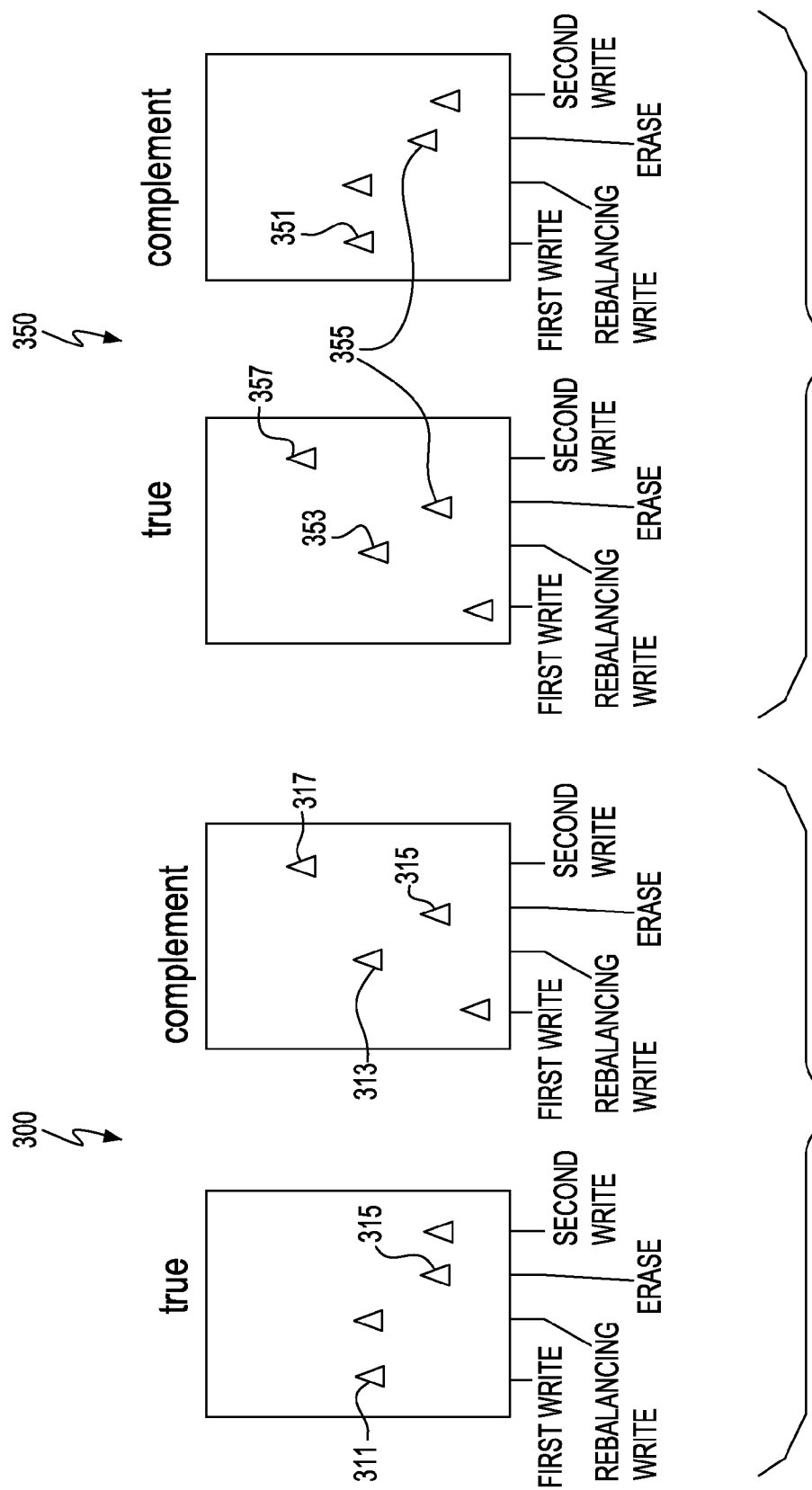

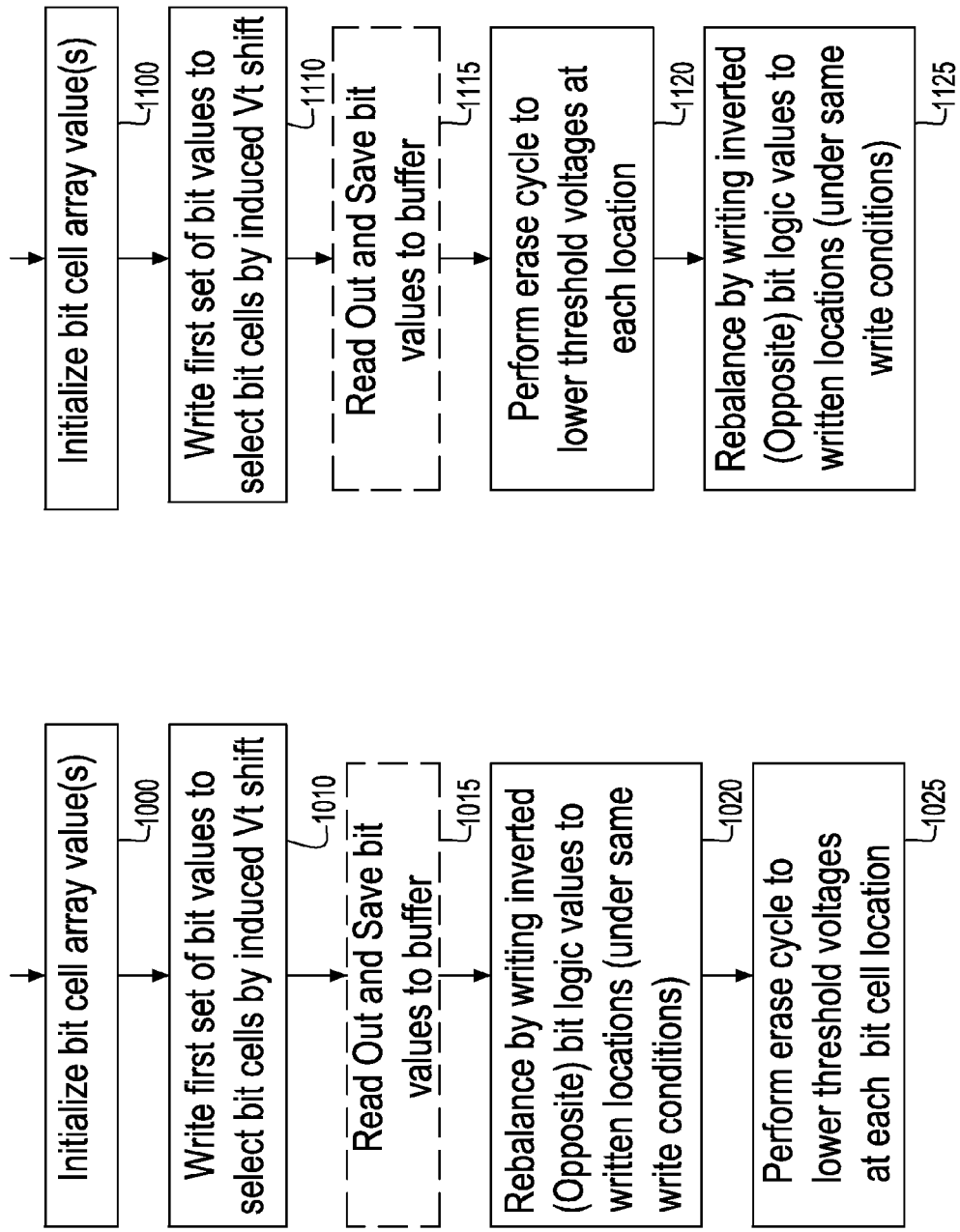

|  | True | Complement |
|---|---|---|
| Initial | 100mV | 100mV |
| After Write 1 | 100mV | 200mV |
| Erase | 100mV | 150 mV |
| Re-balance Write 0 | 150 mV | 150 mV |

FIG. 11

|  | True | Complement |
|---|---|---|
| Initial | 100mV | 100mV |
| After Write 1 | 100mV | 200mV |
| Re-balance Write 0 | 200 mV | 200 mV |

FIG. 12

REBALANCING IN TWIN CELL MEMORY SCHEMES TO ENABLE MULTIPLE WRITES

FIELD OF INVENTION

This disclosure relates generally to electronic circuits such as non-volatile memory circuits of the multi-time programmable type, and particularly a novel system and method for rebalancing voltage thresholds of twin transistor memory cells for writing memory bit cell states.

BACKGROUND

In high density memory systems, a typical non-volatile memory cell may include a metal-oxide semiconductor (MOS) transistor having a parameter, e.g., a transistor device threshold voltage, that may be varied for storing a desired information, e.g., by injecting charges into a floating gate or gate oxide. Accordingly, a current sunk by the memory cell in determining biasing states varies depending on the information stored therein. For example, to store information in a twin-transistor memory cell there is provided two different threshold voltage values for the cell, with each different threshold voltage value associated with a different logic or bit value.

For example, FIG. 1A shows an exemplary non-volatile memory CMOS thin-oxide multi-time programmable memory (MTPM) array 10 which may be part of a memory device, or system. The array consists of plurality of memory cells 11 arranged by 2 dimensional matrix (e.g., m rows and n columns). For simplicity. FIG. 1 shows one column (e.g., n=1) having two rows (e.g., m=2) or two memory cells 11, however the actual memory consists of significantly more cells 11. More specifically, the MTPM array 10 consists of a plurality of twin-transistor memory cells 11 including first and second transistors 15A, 15B. They are connected with a common node 13, coupling to the source line (SL) running vertically and coupling with other cells in the same column in the array 10. In this example, SL is coupled to 0V or Grounded (GND). However, the SL can be coupled to another SL voltage. One terminal 14 of the first transistor 15B of a memory cell 11 and the terminal 16 of the second transistor 15A of the memory cell 11 are coupled to the bitline true (BLT) and the bitline complement (BLC) running vertically, respectively, and coupling to the cells in same column in the array 10.

The MTPM array 10 shown in FIG. 1A further includes two gate electrodes 20A, 20B respectively of the respective first and second transistors 15A, 15B and which are connected to a common wordline (WL) conductor 50, running horizontally, and coupling to other cells in a same row in the array 10.

Prior to use of the memory device 10, the cell 11 should be programmed by increasing one of the transistor threshold voltage (Vt) of the twin transistors 15A and 15B. More specifically, the transistor of the cell undergoes a Vt shift when it is programmed. Typical Vt values without Vt shift (or before programming) may range from about 0.25V to 0.3V. Typical Vt values with Vt shift (or after programming) may range from about 0.45V to 0.5V. In this example, the first transistor 15A is shown exhibiting a first threshold voltage (Vt), e.g., its native Vt or initial value, and the second transistor 15B programmed to exhibit an induced second threshold voltage, e.g., a Vt+shift (added) voltage. However, the VT states of the first and second transistor are interchangeable. When transistor 15B VT has an adder, the state of the programmed cell is 0, and 15A cell has an adder, the state of the programmed cell is 1.

For a program operation, an input digital data signal Din represents a programmable bit value to be written to the target memory cell 11. More specifically, when the target memory cell 11 is subjected to a high gate, or wordline (WL) voltage (e.g., ~2 to 2.2V), and high drain voltage, or the voltage applied to either the BLC or BLT (e.g., ~1.5V-1.8V), with SL grounded, for a few milliseconds (i.e., when it is programmed), its Vt of the transistor (i.e. 15B or 15A) of the target memory cell 11 gets shifted from its nominal value (0.25V~0.3V) to a higher value (e.g., ~0.45 to 0.5V) due to BTI (Bias temperature instability) and HCI (hot carrier injection) effects. Write circuit drivers 25 may be implemented to generate and apply programming voltages for bitline true (BLT) and bitline complement (BLC) conductors for writing a bit voltage value to the cells 15A, 15B depending on the write bit 0 or 1. The target cell is accessed, e.g., via a voltage provided on the wordline WL 50 corresponding to a row of the memory cell, and bit cell voltage values are written to the T or C cell by applying appropriate voltages to the BLT and BLC terminals corresponding to a selected column (complementary lines) of the target memory cell 10. For example the target multi-time programmable bit cell programming voltages generated are applied to WL, BLT and BLC, e.g., while grounding the SL source line.

When no WL signal is applied, or the voltage applied to BL is 0V, the MOS transistors 15A, 15B do not conduct, resulting in retaining their programmed states. Combinations of voltages can be applied to the first terminal, second terminal and gate terminals of the memory cell 10 to program, inhibit program, read and erase the logic state stored by the MOS transistors.

FIG. 1B shows a chart 40 explaining different modes of operation of the multi-time programmable memory array 10 of FIG. 1A including example voltages at the terminals of the cell transistors 15A, 15B that provide cell states including stand-by, write, read and reset. In particular, these states are: 1) a standby state when respective BLT and BLC terminals 14, 16 are floating (or may be 0 Volts) with a wordline WL of 0.0 Volts applied to the gates of each transistor in the twin-cell 15B, 15A; 2) a write logic "0" state, e.g., when the respective BLT terminal 14 is at 1.7 Volts and BLC terminal 16 is floating (or may be at 0.0 Volts) with a wordline WL of 2.2 Volts applied to the gates of each transistor 15B, 15A; however, the voltages on BLT and BLC could be swapped to store a logic "1" value in the cell; 3) a read state, e.g., when a wordline WL of 1.0 Volt (VDD) is applied to the gates of each transistor 15B, 15A in the twin-cell, each respective BLT terminal and BLC terminal voltage values are precharged to 0.5V and 0.3V for logic "0" state, respectively (or vise-versa for logic "1" state"). This results in developing a differential voltage (~0.2V) between BLT and BLC proportional to the Vt shift (~0.2V) in the cell; and 4) an erase state, e.g., when both BLT and BLC terminals 14 and 13 in the respective column are at 1.7 Volts with a wordline WL of −1.0 Volts applied to the gates of both transistors 15B and 15A.

Referring to FIG. 1A, generally, in electronic circuits having such bit memory array 10, the sense amplifier circuit 30 is provided for obtaining a stored bit value, i.e., perform a memory read operation. Typically, the sense amplifier 30 senses whether the T(true) or C(complement) transistor is programmed (Vt shifted). Such sense amplifier circuit 30 reads a selected memory cell BLT voltage and BLC voltage value at respective BLT terminal 14 and BLC terminal 16 conductors for cells selected by an applied WL voltage, and as selected by a respective corresponding column select transistor 22B and 22A to select the corresponding target cell via a corresponding Col_Select (T) select signal 23B and/or Col_Select (C) select signal 23A for complementary signals. The column select signals 23A and 23B are the same for one pair of BLT and BLC conductors. As shown in FIG. 1A, the conventional sense amplifier circuit 30 performs a differential read.

In the read operation, the programmed BLT (or BLC) value is dependent upon the sense circuitry of the sense amplifier and across process/voltage/temperature variations. However, the sense amplifier circuitry 30 needs to detect a differential voltage (e.g., typically ~200 mV), e.g., shifts in Vt signal in the cell between the true/complement transistors 15A, 15B, that may result from a possible threshold voltage shift, e.g., during a read operation 35 of FIG. 1B. For example, the read state of about 0.5 volts (500 mV) for BLC (15A native state, or no Vt shift state) and the read state of about 0.3 volts (300 mV) for BLT (15B programmed state, or Vt shift state). This results in about a 0.2V (200 mV) data-dependent differential voltage built between BLT and BLC are shown in FIG. 1B for the sensing of BLT programmed state.

The use of twin-transistor, shown in FIG. 1A has been proposed for non-volatile memories to reduce sensitivity to device variation. However, if the twin transistor has initial VT offset prior to the programming, the twin cell approach causes a read failure unless the VT shift is more than the initial Vt offset. The initial Vt offset may be caused by the partial erasing condition after the programming for multiple write memory use.

SUMMARY

In one aspect, the present invention proposes a system and method of memory cell "Rebalancing" to enable multiple write capability of such twin-transistor memory cell circuits where the mechanism for data storage permits a continuous variation of the property of the device (e.g., a device parameter) over a broad range, especially when the erase function is either non-existent or not very effective.

Such a rebalancing mechanism involves applying an inverse of the existing data to bring the true and complement sides of the twin-transistor memory cell back to equilibrium, prior to subsequent erase or writes can enable multiple write cycles, even when the erase function is poor or non-existent.

A system and method for writing to and sensing bit values from a twin-transistor memory cell is employed that uses a rebalancing mechanism for employment in cases where a small differential voltage (e.g., resulting from a possible threshold voltage shift) is to be sensed.

In one aspect, there is provided a method of operating a multi-time programmable memory cell, the memory cell having a series connection of a first (true) transistor and a second (complement) transistor. The method comprises: writing, using a write circuit at select memory cell locations, initial bit values to one or more select memory cells; rebalancing, using the write circuit, a state of a parameter associated with first or second transistor devices at each the select memory cell, and erasing, at each the rebalanced select memory cell, the written initial bit value.

Further to this aspect, the rebalancing and cell erasing of the select memory cell is performed prior to a writing of a next bit value at the select memory cell.

Further, there is provided a system of operating a multi-time programmable memory cell, the multi-time programmable memory cell having a series connection of a first (true) transistor and a second (complement) transistor. The system comprises: a memory device having multiple multi-time programmable memory cells; a write circuit configured to write, by applying voltage values to one or more of the true transistor and/or complement transistor devices, initial bit values to one or more select memory cells; the write circuit further configured to rebalance a parameter associated with one or more transistor devices of the differential transistor pair, at each the select memory cell, and the write circuit further configured to erase, at each the rebalanced select memory cell, the written initial bit value.

In the system, the writing circuit is configured to repeat the rebalancing and select memory cell erasing prior to a writing of a next bit value at the select memory cell.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIG. 3 shows a table 150 depicting an example cycle of write operations that may lead to an incomplete solution;

FIG. 4A shows an example of programming threshold voltage states 200 for each transistor of a twin-transistor memory cell resulting from application of "re-balancing" write operations in one embodiment;

FIG. 4B shows a further example of programming threshold voltage states 250 for each transistor of a twin-transistor memory cell of FIG. 4A in one embodiment;

FIG. 5A shows example programming threshold voltage states 300 for each transistor of a twin-transistor memory cell resulting from application of "re-balancing" erase operations in an embodiment;

FIG. 5B shows further example programming threshold voltage states 350 for each transistor of the twin-transistor memory cell of FIG. 5A in one embodiment;

FIG. 9A shows a flow chart of a first embodiment of a method of operating a multi-time programmable memory cell, such as the multi-time programmable memory cells of FIG. 8;

FIG. 9B shows a flow chart of a second embodiment of a method of operating a multi-time programmable memory chip consisting of a plurality of multi-time programmable memory cells of FIG. 8;

FIG. 11 shows a second example application of the method of FIG. 9B for programming parameter values for each True transistor and Complement transistor of a twin-transistor memory cell; and, FIG. 12 shows a third example application of the method of FIG. 9C for programming parameter values for each True transistor and Complement transistor of a twin-transistor memory cell.

DETAILED DESCRIPTION

Use of twin cell memory architecture has been proposed for non-volatile memories to reduce sensitivity to device variation. The systems and methods herein extend the useful lifetime of the twin cell flash memory to enable multiple write cycles by employing a rebalancing the Vt.

More specifically, for non-volatile twin cell memories which have write and effective erase conditions, multiple write cycles is achieved. However, in situations where erase is non-existent or poor, multiple writing will be problematic. A rebalancing where the inverse of the existing data to bring the true and complement sides of the twin cell back to equilibrium, prior to subsequent erase or writes can enable multiple write cycles, even when the erase function is poor or non-existent.

FIGS. 2-4 show example system and methods for "Rebalancing" a twin-transistor memory cell including true and complement transistors to enable multiple write capability of such circuits where the mechanism for data storage permits a continuous variation of the property of the device over a broad range.

Figure 1B:
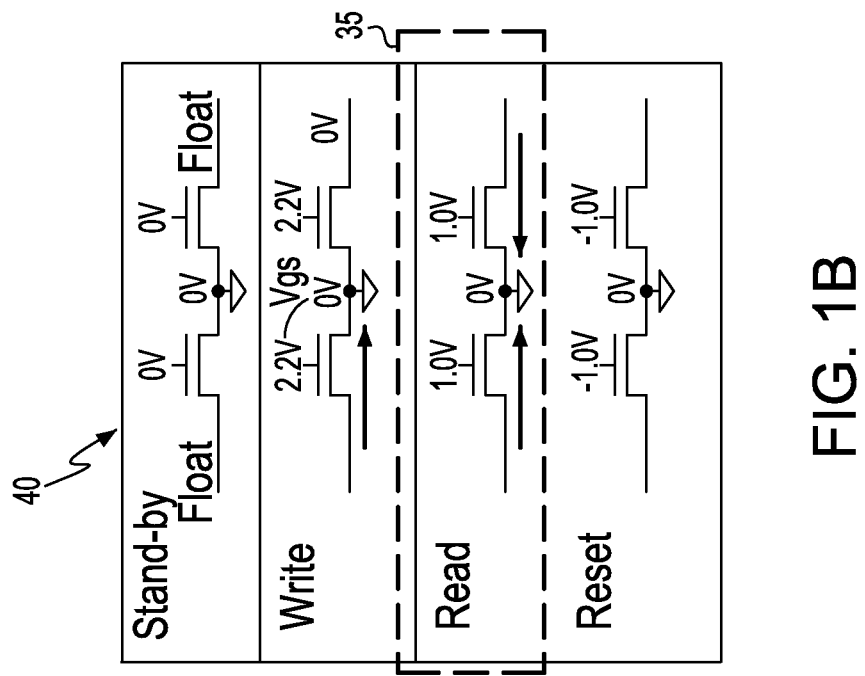
FIG. 1B depicts a chart of the programmable states of the multi-time programmable memory array 10 of FIG. 1A and the exemplary voltage levels sensed by a sense amplifier circuit.
Figure 1A:
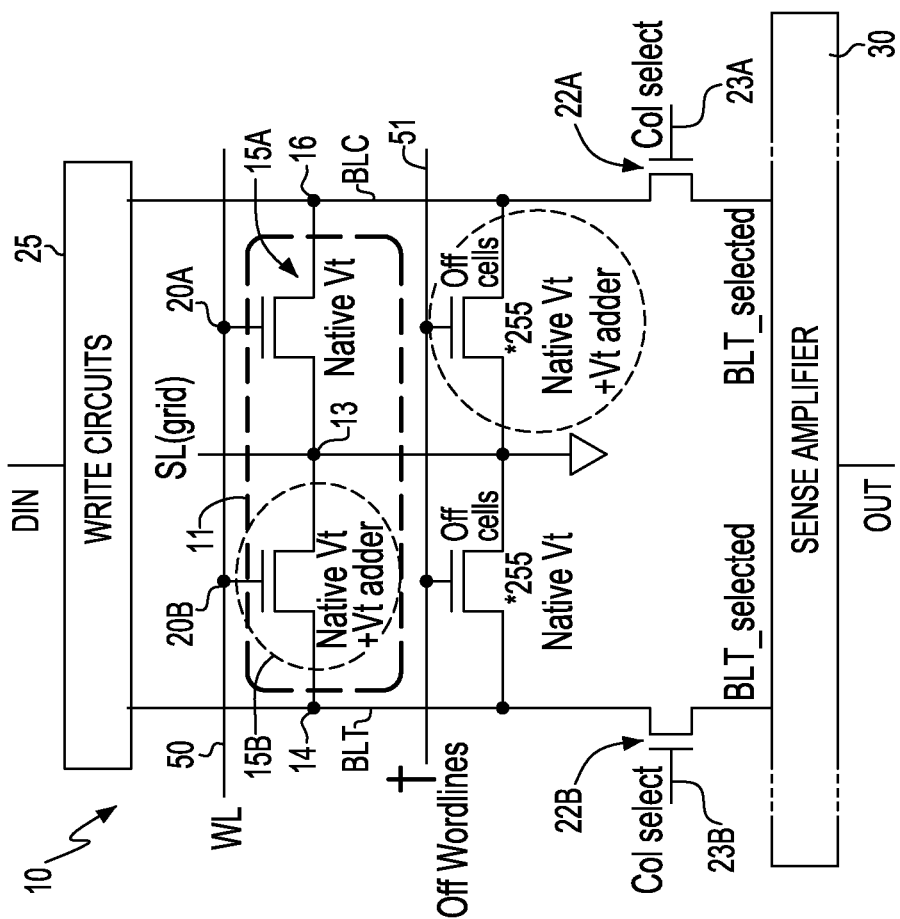
FIG. 1A depicts a multi-time programmable memory array 10 having a plurality of twin-transistor memory cells 11, where SL is coupled to GND.
Figures 2A, 2B:
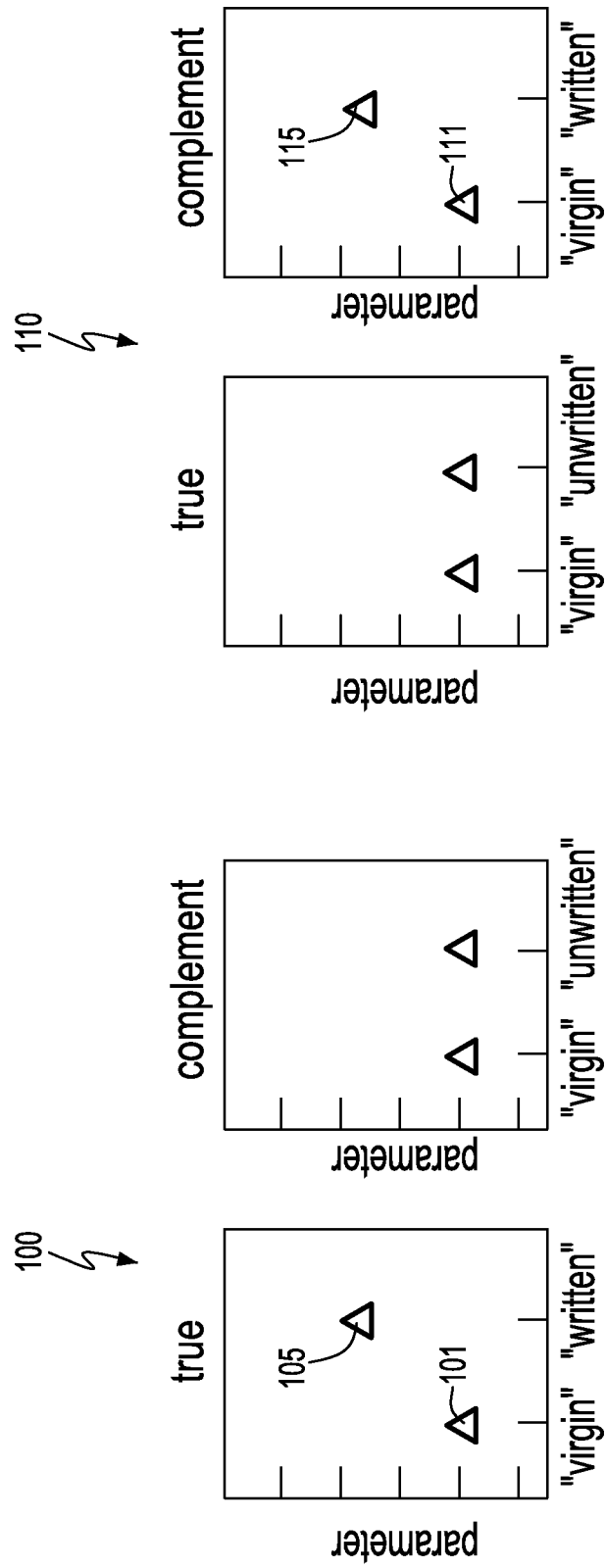
FIG. 2A shows an example initial threshold voltage (virgin) and after programming threshold voltage (written) state 100 for each transistor of a twin-transistor memory cell.
FIG. 2B shows example initial threshold voltage (virgin) and after programming threshold voltage (written) states 110 for each transistor of a twin-transistor memory cell resulting from write operations.

In particular, FIG. 2A shows an example initial programming threshold voltage state 100 for each transistor of a twin-transistor memory cell pair resulting from write operations. FIG. 2A particularly shows example programmed threshold voltage states for such paired transistors 15A, 15B of FIG. 1.

For example, a zero (0) logic voltage state 100 is represented as a pair of threshold voltage values corresponding to each of the programmed threshold voltages exhibited by the first (e.g., True) and second (e.g., Complementary). In this example of FIG. 2A, a twin-transistor cell states are shown with the first (complementary) transistor exhibiting a first threshold voltage, e.g., native Vt or initial Vt in its "virgin" or unwritten state 101, and the second (true) transistor being written to exhibit a second threshold voltage, e.g., Vt+shift (added) voltage 105. In one embodiment, the "complementary" transistor may have its virgin native programmed threshold voltage state value of about 100 mV, and the "true" transistor having a modified threshold voltage value, e.g., an addition 100 mV, such that its threshold voltage become 200 mV (a Vt shift=threshold voltage+added voltage) on either the T- or C-transistor. That is, for writing a logic 0, the True side transistor threshold voltage is elevated to approximately 200 mV and the complementary transistor threshold voltage is at its native threshold value, e.g., an unwritten state, of approximately 100 mV.

Likewise, FIG. 2B shows example initial programming threshold voltage states 110 for each transistor of a twin-transistor memory cell pair resulting from write operations. FIG. 2B particularly shows example programmed threshold voltage states 110 for such paired transistors 15A, 15B of FIG. 1 wherein the same pair of true and complementary transistors are programmed (written) with voltage thresholds for writing a logic (1). That is, in this example of FIG. 2B, the twin-transistor cell is shown with the second (true) transistor exhibiting a first threshold voltage 111, e.g., it native Vt or initial Vt in its virgin or unwritten state, and the first (complementary) transistor exhibiting a second induced threshold voltage, e.g., Vt+shift (added) voltage 115. In one embodiment, the "complementary" transistor may have a modified threshold voltage value of an additional added 100 mV (such that its threshold become 200 mV), and the "true" transistor having a native programmed threshold voltage state value, e.g., 100 mV. That is, for writing a logic 1, the complementary side transistor threshold voltage is elevated to approximately 200 mV and the true threshold voltage is its native threshold value, e.g., approximately 100 mV.

It is understood that in the embodiments of FIG. 2A, the controllable parameter is the programmed transistor threshold values and, via the write circuits of FIG. 1, the transistor in each cell may be separately programmed to have a Vt shift induced in either the True or the Complement transistor of the twin-transistor memory-cell. To evaluate a bit value, the sense circuit 30 of FIG. 1 must determine for which side (true/complement) the parameter is larger. Thus, the delta of threshold voltage values (e.g., 200 mV–100 mV=100 mV) of the true and complement transistor of the memory cell governs its logic state.

In the course of operations involving the twin-transistor memory cell, the systems and methods herein process each twin-transistor, memory cell by first erasing the values of the cell, and then re-writing the values of the cell through "rebalancing". Rebalancing consists of writing the inverse of the previous written data. Cells are "re-balanced" to avoid a hysteresis phenomenon where a prior programmed states (transistor threshold voltage) can not be adequately discharged, i.e., an erase cycle to discharge a prior programmed twin-transistor state voltage state is partial or incomplete.

As an illustration, FIG. 3 shows a table 150 depicting an example cycle of write operations that may lead to an incomplete solution. At 151, the initial native twin-transistor states shows both the True transistor and Complement transistor at their native 100 mV threshold voltage value. In the initial writing of a logic 1 bit value, at 153, for example, an additional 100 mV is induced in the Complement transistor side to increase its threshold voltage to a modified 200 mV. At 155, an erase cycle is performed to bring the complementary transistor 200 mV modified threshold voltage value back to its native value of 100 my if all the charge trapped in complemented transistor can be eliminated. However, as shown, due to hysteresis phenomena, the threshold voltage value is only reduced to 150 mV on the Complementary transistor, because some of the charge remains in the complemented transistor. That is, for example, the 200 mV threshold voltage may not fully discharge to its native 100 mV state, but, for example, may only decrease to a 150 mV value as shown in the table of FIG. 3. Subsequently, the same twin-transistor memory-cell is again programmed to have written a logic 1 bit value which, in programmed manner, results in applying additional induced voltage of 100 mV again on the Complementary transistor. The resulting threshold voltages for True and Complementary transistors is shown at 157, where the additional 100 mV causes the threshold voltage of the Complementary transistor to increase from its previous state to about 250 mV. Table 150 of FIG. 3 shows the result of the next erase cycle at 158, where due to hysteresis the threshold voltage of the Complementary transistor is again only reduced by 50 mV to about 200 mV. FIG. 3 at 160 shows the resulting problem when a logic (0) is programmed into the same twin-transistor memory cell. The programming of logic zero (0) state requires an additional induced voltage of 100 mV at the True transistor; however adding this additional device threshold voltage results in both True and Complement transistors having the same threshold voltage 200 mV which is a problem as the sensing circuit may not evaluate this as a logic value, but rather indeterminate.

FIG. 4A shows an example of programming threshold voltage states 200 for each transistor of a twin-transistor memory cell pair resulting from application of "re-balancing" write operations. In the programmed scheme 200 shown in FIG. 4A, it is assumed each of the twin-transistors of the memory cell are initialized at their native voltage threshold values (e.g., 100 mV each).

FIG. 4A shows a result of programming an initial logic 0 value in this twin-transistor memory cell. For programming this value, the True-side transistor of the memory cell is programmed with additional induced threshold voltage increased relative to the corresponding initial Complementary transistor threshold voltage value as shown at 211. When a new logic value is to be written, e.g., a logic 1 is to be written to this memory cell, the memory cell is first re-balanced, i.e., threshold voltages are manipulated to accommodate the next logic bit value to be programmed. This re-balance programming may occur immediately prior to an erase cycle or the next write cycle. For example, while the logic (0) was initially programmed with threshold voltage results of the True transistor and Complementary transistor side at 211, a re-balancing cycle is next performed such that the threshold voltage values at each True transistor and Complementary transistor become equal. This depicted a rebalancing step 213 where the threshold voltage of the Complementary transistor is increased while the threshold voltage of the True transistor side remains the same (from its prior programmed logic 0 value) resulting in the threshold voltage values at each True transistor and Complementary transistor become equal. The re-balancing in this embodiment is a result of physically programming the opposite bit value into the memory cell from its prior programmed state, e.g., a logic 1 in this example, where the threshold voltage of the Complementary transistor of the twin-transistor memory cell would be increased relative to the threshold voltage of the True transistor thus rendering them equal. Finally, with the threshold voltages of each transistor being equalized, a new memory cell logic 1 value may be easily programmed at 215, i.e., the Complementary transistor threshold voltage is raised relative to the threshold voltage of the True transistor.

FIG. 4B shows a further example of programming threshold voltage states 250 for each transistor of a twin-transistor memory cell resulting from application of "re-balancing" write operations. In the programmed scheme 250 shown in FIG. 4B, it is assumed each of the twin-transistors of the memory cell are initialized at their native voltage threshold values (e.g., 100 mV each).

As shown, the example 250 of FIG. 4B shows a result of programming an initial logic 1 value in this twin-transistor memory cell. For programming this value, the Complementary-side transistor of the memory cell is programmed with additional induced threshold voltage increased relative to the corresponding initial True transistor threshold voltage value as shown at 251. When a new logic value is to be written, e.g., a logic 0 is to be written to this memory cell, the memory cell is first re-balanced, i.e., threshold voltages are manipulated to accommodate the next logic bit value to be programmed. This re-balance programming may occur immediately prior to an erase cycle or the next write cycle. For example, while the logic (1) was initially programmed with threshold voltage results of the True transistor and Complementary transistor side at 251, a re-balancing cycle is next performed such that the threshold voltage values at each True transistor and Complementary transistor become equal. FIG. 4B depicts the rebalancing step 253 where the threshold voltage of the True transistor is increased while the threshold voltage of the Complementary transistor side remains the same (from its prior programmed logic 1 value) resulting in the threshold voltage values at each True transistor and Complementary transistor become equal. The re-balancing in this embodiment is a result of physically programming the opposite bit value into the twin-transistor memory cell, i.e., a logic 0 in this example, where the threshold voltage of the True transistor of the twin-transistor memory cell would be increased relative to the threshold voltage of the Complementary transistor thus rendering them equal. Finally, with the threshold voltages of each transistor being equalized, a new memory cell logic 0 value may be easily programmed at 255, i.e., the True transistor threshold voltage is raised relative to the threshold voltage of the Complementary transistor.

While FIGS. 4A and 4B illustrate the concept of programming twin-transistor memory cell according to one embodiment, it may be the case that the number of write cycles may be limited according to factors such as: a) Sense circuit requirement for amount of change in the parameter (e.g., threshold voltage value) to guarantee correct sensing; b) The width of the distribution of the parameter being measured (distributions for virgin, post-write1, post rebalance1, post-write2, post rebalance2, etc.); and/or c) The range over which the parameter can be changed and sensed correctly.

Thus, in a further embodiment, the number of write cycles can be increase if there is a mechanism for erasing (reversing change in parameter caused by write—either completely or partially).

In one embodiment, the re-balancing which is a result of physically programming the opposite bit value into the twin-transistor memory cell, may comprise an erase cycle as depicted in FIGS. 5A-5B which depict example twin-transistor, single memory cell processing in a further embodiment, where the determination is made as to whether an erase process can restore the parameter to the virgin conditions accurately and reproducibly. If an erase process can restore the parameter to the virgin conditions accurately and reproducibly, multiple rewrites do not need rebalancing.

FIG. 5A shows example programming threshold voltage states 300 for each transistor of a twin-transistor memory cell resulting from application of "re-balancing" write operations where the write rebalancing approach is applied before a bit-erasing operation, i.e., it is assumed that an applied erase cycle operation occurs subsequent to the write re-balancing.

In the programmed scheme 300 shown in FIG. 5A, it is assumed each of the twin-transistors of the memory cell are initialized at their native voltage threshold values (e.g., 100 mV each).

In FIG. 5A, a result of programming an initial logic 0 value in this twin-transistor memory cell is shown. For programming this value, the True-side transistor of the memory cell is programmed with additional induced threshold voltage increased relative to the corresponding initial Complementary transistor threshold voltage value which remains at its initial threshold voltage state as shown as the resulting "First Write" value at 311. When a new logic value is to be written, e.g., a logic 1 is to be written to this memory cell, the memory cell is first re-balanced, i.e., threshold voltages are manipulated to accommodate the next logic bit value to be programmed. In this embodiment, the re-balance programming scheme applies an added threshold voltage to the Complementary transistor to increase the threshold voltage at the complementary transistor and thereby render the threshold voltage values of both True and Complementary transistors equal as shown at 313 as a result of the re-balancing write operation. Then a bit-erase cycle is programmed which results in the threshold voltages of both True and Complementary to be reduced by like amount as indicated at 315. That is, the erase cycle, in this example, can restore each true or complementary transistor to its new balanced state, which may be higher than initial native (virgin state). Because the true and complement VT value is equal after the erase 315, the differential VT between true and complement transistors for subsequent write cycle can be same as the first write cycle even if the recovering VT by 315 is not fully realized. For example, a second write operation is performed to physically program the opposite bit value into the twin-transistor memory cell, e.g., program a logic value 1. To program the opposite logic value, an additional induced threshold voltage is applied to the Complementary-side transistor which is increased relative to the corresponding True-side transistor threshold voltage value which remains at its re-balanced level from the prior step. The resulting new programmed value is shown as the result of a "Second Write" operation depicted at 317, which is higher than the first write level of 311, because of the rebalancing write 313 and erase 315 operation. This results in developing a same differential VT voltage after the second programming 317.

FIG. 5B shows a further example of programming threshold voltage states 350 for each transistor of a twin-transistor memory cell resulting from application of "re-balancing" operations where a write rebalancing approach is applied before an erasing step, i.e., it is assumed that an applied erase cycle operation occurs subsequent to the write re-balancing In FIG. 5B, a result of programming an initial logic 1 value in this twin-transistor memory cell is shown. For programming this logic value, the Complementary transistor of the memory cell is programmed with additional induced threshold voltage increased relative to the corresponding initial True transistor threshold voltage value which remains at its initial threshold voltage state as shown as the resulting "First Write" value at 351. When a new logic value is to be written, e.g., a logic 0 is to be written to this memory cell, the memory cell is first re-balanced, i.e., threshold voltages are manipulated to accommodate the next logic bit value to be programmed. In this embodiment, a write re-balance programming scheme applies an added threshold voltage to the True transistor to increase the threshold voltage at the true-side transistor and thereby render the threshold voltage values of both True and Complementary transistors equal as shown at 353 as a result of the re-balancing write operation. Then a bit-erase cycle is programmed which results in the threshold voltages of both True and Complementary to be reduced by like amount as indicated at 355. That is, the erase cycle, in this example, restores each true or complementary transistor to its native (virgin) state. Because the true and complement VT value is equal after the erase 355, the differential VT between true and complement transistors for subsequent write cycle can be same as the first write cycle even if the recovering VT by 355 is not fully realized. For example, a second write operation is performed to physically program the opposite bit value into the twin-transistor memory cell, e.g., program a logic value 0. To program the opposite logic value, an additional induced threshold voltage is applied to the True-side transistor which threshold value is increased relative to the corresponding Complementary-side transistor threshold voltage value which remains at its re-balanced level from the prior bit-erase step. The resulting new programmed value is shown as the result of a "Second Write" operation depicted at 357, which is higher than the first write level of 351, because of the rebalancing write 353 and erase 355 operation. This results in developing a same differential VT voltage after the second programming 357.

In one embodiment, if it is known or determined that an erase process can only partially recover the parameter change (e.g., threshold voltage change) after writing, subsequent rewrites will suffer from reduced read margin. Thus, the re-balancing which is a result of physically programming the opposite bit value into the twin-transistor memory cell, may comprise a partial erase cycle as depicted in processing results shown in FIGS. 6A-6B involving an erase process that can not fully restore the parameter to the virgin conditions accurately and reproducibly, thus requiring additional rewrites for rebalancing. However, in this embodiment, using the same write conditions for the second write cycle e.g., "write2" as the prior write cycle "write1" now results in a decreased margin for sensing.

Figures 6A, 6B:
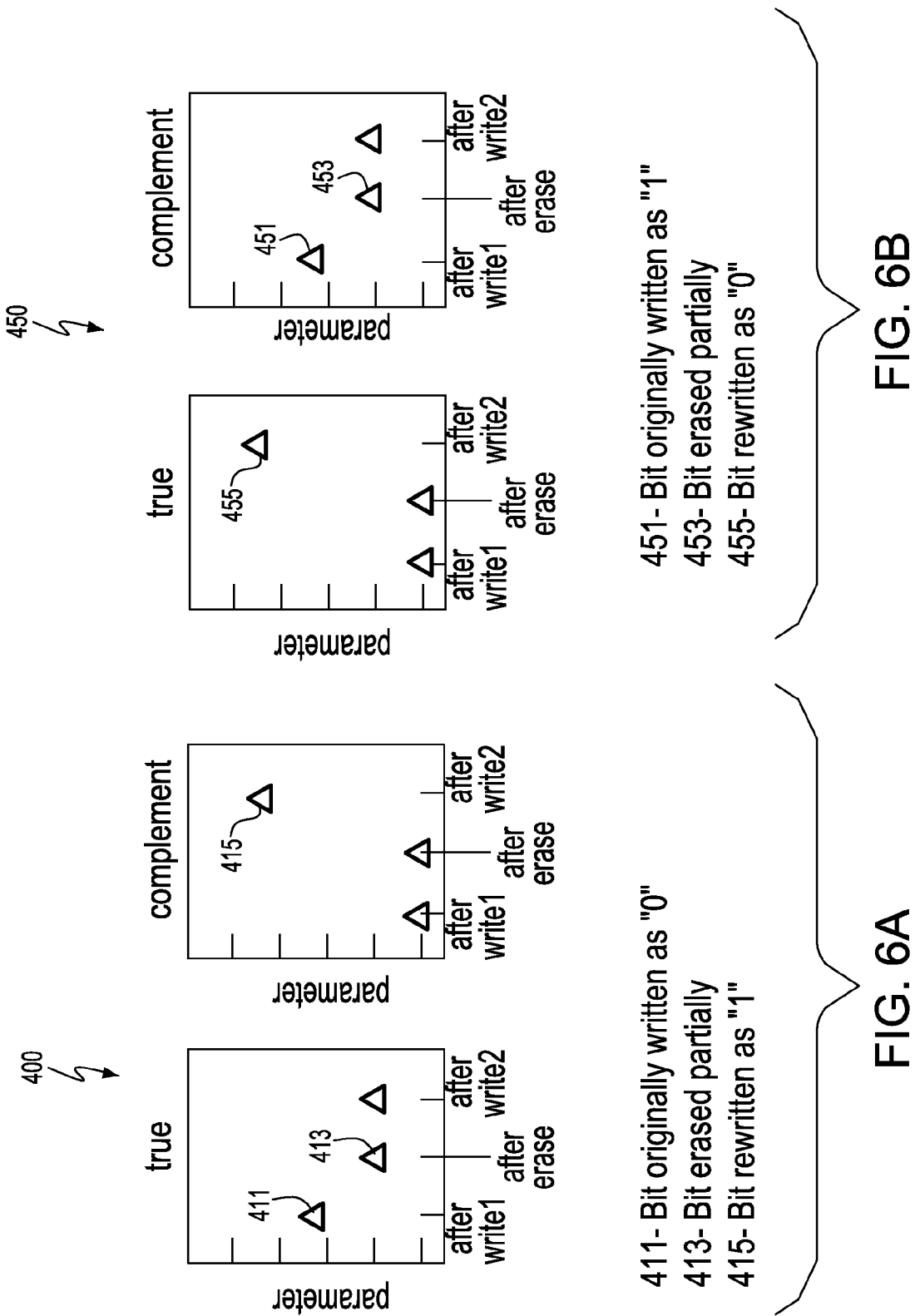
FIG. 6A shows example programming threshold voltage (Vt) states 400 for each transistor of a twin-transistor memory cell resulting from application of "partial re-balancing" erase operations in an embodiment assuming that an applied erase cycle operation is partial or incomplete.
FIG. 6B shows further example programming threshold voltage states 450 for each transistor of the twin-transistor memory cell of FIG. 6A in one embodiment.

FIG. 6A shows example programming threshold voltage states 400 for each transistor of a twin-transistor memory cell resulting from application of "partial re-balancing" erase operations where it is assumed that an applied erase cycle operation is partial or incomplete, i.e., the erase cycle can not fully restore each true or complementary transistor to its native (virgin) state with accuracy and reproducibility. In the programmed scheme 400 shown in FIG. 6A, it is assumed each of the twin-transistors of the memory cell are not fully initialized at their native voltage threshold values (e.g., 100 mV each).

In FIG. 6A, a result of programming an initial logic 0 value in this twin-transistor memory cell is shown. The partial erase problem of the true transistor can be compensated by shifting more Vt for the $2^{nd}$ write of the complement transistor. Thus, for programming this logic 0 value, the True-side transistor of the memory cell is programmed with additional induced threshold voltage increased relative to the corresponding initial Complementary transistor threshold voltage value which remains at its initial threshold voltage state as shown as the "after write 1" value at 411. When a new logic value is to be written, e.g., a logic 1 is to be written to this memory cell, the memory cell is first re-balanced, i.e., threshold voltages are manipulated to accommodate the next logic bit value to be programmed. This re-balance programming includes a partial (or incomplete) erase cycle. For example, while the logic (0) was initially programmed with threshold voltage results of the True transistor and Complementary transistor side at 411, a "partial" bit-erase cycle is next performed such that the threshold voltage value at the True transistor becomes modified. This is depicted as partial bit erasing step 413 where the threshold voltage of the True transistor is decreased, however due to device physics, not decreased back to its initial native threshold value, while the threshold voltage of the Complementary transistor side remains the same (at its native threshold voltage value) resulting in the threshold voltage values at each True transistor and Complementary transistor becoming an partial rebalancing. The partial re-balancing is a result of physically erasing, albeit partially, the prior programmed bit value of the memory cell from its prior programmed state, e.g., a logic 0 in this example, to result in transistor thresholds within a small margin of each other. Finally, with the threshold voltages of each transistor being within a small margin of each other, thus may causes a fail for subsequent write if the VT shift is same as the first VT sift of the true transistor. In order to overcome the problem, a second write 415 of the complement transistor increases (or decrease) the VT shift by additional VT shift to compensate the partial erase VT shift amount, resulting in same margin as the first write. The additional VT shift can be done by increasing the subsequent writ cycle than previous write cycle if write pattern is different from the previous cycle, as shown in the example in FIG. 6A. However, the write cycle should be shorter than the previous cycle to reduce the amount of the VT shift if the subsequent write pattern is same as the previous cycle (not shown), because the partial erase already hit some amount of VT prior to the subsequent write operation.

FIG. 6B shows example programming threshold voltage states 450 for each transistor of a twin-transistor memory cell pair resulting from application of "re-balancing" erase operations where it is assumed that an applied erase cycle operation is partial or incomplete, i.e., the erase cycle can not fully restore each true or complementary transistor to its native (virgin) state with accuracy and reproducibility. In the programmed scheme 450 shown in FIG. 6B, it is assumed each of the twin-transistors of the memory cell are initialized at their native voltage threshold values (e.g., 100 mV each).

In FIG. 6B, a result of programming an initial logic 1 value in this twin-transistor memory cell is shown. The partial erase problem of the complement transistor can be compensated by shifting more Vt for the $2^{nd}$ write of true transistor. Thus, for programming this logic 1 value, the Complement-side transistor of the memory cell is programmed with additional induced threshold voltage increased relative to the corresponding initial True transistor threshold voltage value which remains at its initial threshold voltage state as shown as the "after write 1" value at 451. When a new logic value is to be written, e.g., a logic 0 is to be written to this cell, the memory cell is first re-balanced, i.e., threshold voltages are manipulated to accommodate the next logic bit value to be programmed. This re-balance programming includes a partial bit erase cycle. For example, while the logic (1) was initially programmed with threshold voltage results of the True transistor and Complementary transistor side at 451, a partial bit-erase cycle is next performed such that the threshold voltage values at each True transistor and Complementary transistor becomes modified. This is depicted as bit erasing step 453 where the threshold voltage of the Complementary transistor is decreased, however not decreased back to its initial native threshold value, while the threshold voltage of the True transistor side remains the same (at its native threshold voltage value) resulting in the threshold voltage values at each True transistor and Complementary transistor becoming an partial rebalancing. This partial re-balancing is a result of physically erasing, albeit partially, the prior programmed bit value of the twin-transistor memory cell from its prior programmed state, e.g., a logic 1 in this example, to result in transistor thresholds within a small margin of each other, and thus may causes a fail for subsequent write if the VT shift is the same as the first VT sift of the complement transistor. In order to overcome the problem, second write 451 of the true transistor increases (or decreases) the VT shift by additional VT shift to compensate the partial erase VT shift amount, resulting in same margin as the first write. The additional VT shift can be done by increasing the subsequent writ cycle than previous write cycle if write pattern is different from the previous cycle, as shown in the example in FIG. 6B. However, the write cycle should be shorter than the previous cycle to reduce the amount of the VT shift if the subsequent write pattern is same as the previous cycle (not shown), because the partial erase already shift some amount of VT prior to the subsequent write operation.

The embodiment of FIGS. 6A-6B overcome the partial erase problem, however the subsequent write needs to control to compensate the partial erase amount, which depends on the previous write cycle. This problem can be significantly simplified by including a rebalancing write operation prior to the subsequent write operation. More specifically, the rebalance operation employs a less aggressive parametric shift than the conventional write process prior to the subsequent write operation to compensate the partial erase amount.

Figures 7A, 7B:
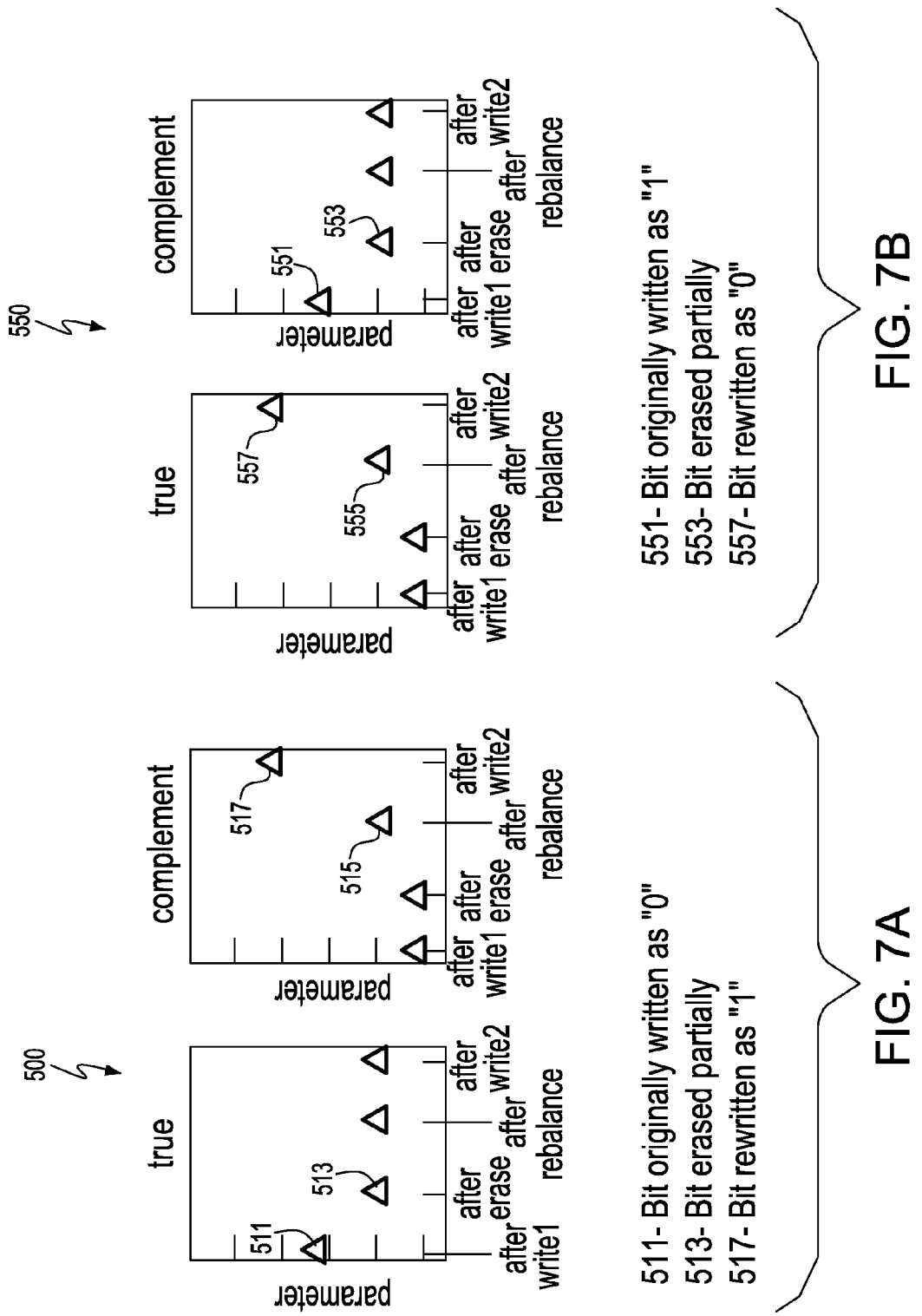
FIG. 7A shows example programming threshold voltage (Vt) states 500 for each transistor of a twin-transistor memory cell resulting from application of "re-balancing" write operations subsequent to a prior applied erase cycle operation that is partial or incomplete.
FIG. 7B shows further example programming threshold voltage states 550 for each transistor of the twin-transistor memory cell of FIG. 7A in one embodiment.

FIGS. 7A-7B depict a rebalancing that involving a prior performed erase process that can not fully restore the parameter to the virgin conditions accurately and reproducibly, thus requiring additional rewrites for rebalancing. However, in this embodiment, using the same write conditions for the second write cycle e.g., "write2" as the prior write cycle "write1" now results in a decreased margin for sensing as achieved in the prior "write1" cycle. The re-balancing could be performed using the wordline (WL) or whole chip buffer as the various embodiments described herein.

FIG. 7A shows example programming threshold voltage states 500 for each transistor of a twin-transistor memory cell pair resulting from application of "partial re-balancing" erase operations subsequent to a prior applied erase cycle operation that is partial or incomplete, i.e., the erase cycle can not fully restore each true or complementary transistor to its native (virgin) state with accuracy and reproducibility. In the programmed scheme 500 shown in FIG. 7A, it is assumed each of the twin-transistors of the memory cell are initialized at their native voltage threshold values (e.g., 100 mV each).

In FIG. 7A, a result of programming an initial logic 0 value in this twin-transistor memory cell is shown. For programming this value, the True-side transistor of the memory cell is programmed with additional induced threshold voltage increased relative to the corresponding initial Complementary transistor threshold voltage value which remains at its initial threshold voltage state as shown as the "after write 1" value at 511. When a new logic value is to be written, e.g., a logic 1 is to be written to this cell, the twin-transistor memory cell is first erased. This bit erasure is a partial (or incomplete) erase cycle. For example, while the logic (0) was initially programmed with threshold voltage results of the True transistor and Complementary transistor side at 511, a "partial" bit-erase cycle is next performed such that the threshold voltage value at the True transistor becomes modified. This is depicted as partial bit erasing step 513 where the threshold voltage of the True transistor is decreased, however due to device physics, not decreased back to its initial native threshold value, while the threshold voltage of the Complementary transistor side remains the same (at its native threshold voltage value) resulting in the threshold voltage values at each True transistor and Complementary transistor becoming within a small difference margin of each other. In this embodiment, a result of physically erasing, albeit partially, the prior programmed bit value of the twin-transistor memory cell from its prior programmed state, e.g., a logic 0 in this example, results in partial rebalancing. Then, as further depicted at 515, a re-balance write operation is applied such that the threshold voltage of the Complementary transistor is increased to a value that is equal to the (partially) recovered threshold voltage of the partially erased bit of the True transistor. This is accomplished by writing an opposite value data, a partial logic 1 (small VT shift to compensate the partial erase 513) is written, e.g., by raising the threshold voltage value of the Complementary transistor at 515 while the True transistor threshold voltage value remains the same. This results in a complete rebalancing for subsequent write. Finally, with the threshold voltages of each transistor now being equal to each other in value, the memory-cell may be easily programmed, i.e., re-written, with a new memory logic 1 value, as shown at 517, i.e., by raising the Complementary transistor threshold voltage relative to the threshold voltage of the True transistor which remains the same from its prior state.

FIG. 7B shows example programming threshold voltage states 550 for each transistor of a twin-transistor memory cell pair of FIG. 7A resulting from application of "re-balancing" erase operations where it is assumed that an applied erase cycle operation is partial or incomplete, i.e., the erase cycle can not fully restore each true or complementary transistor to its native (virgin) state with accuracy and reproducibility. In the programmed scheme 550 shown in FIG. 7B, it is assumed each of the twin-transistors of the memory cell are initialized at their native voltage threshold values (e.g., 100 mV each).

In FIG. 7B, a result of programming an initial logic 1 value in this twin-transistor memory cell is shown. For programming this value, the Complement-side transistor of the memory cell is programmed with additional induced threshold voltage increased relative to the corresponding initial True transistor threshold voltage value which remains at its initial threshold voltage state as shown as the "after write 1" value at 551. When a new logic value is to be written, e.g., a logic 0 is to be written to this cell, the twin-transistor memory cell is first erased. This bit erasure is a partial (or incomplete) erase cycle. For example, while the logic (1) was initially programmed with threshold voltage results of the True transistor and Complementary transistor side at 551, a "partial" bit-erase cycle is next performed such that the threshold voltage value at the Complementary becomes modified. This is depicted as partial bit erasing step 553 where the threshold voltage of the Complementary transistor is decreased, however due to device physics, not decreased back to its initial native threshold value, while the threshold voltage of the True transistor side remains the same (at its native threshold voltage value) resulting in the threshold voltage values at each True transistor and Complementary transistor becoming an imperfect rebalancing. In this embodiment, a result of physically erasing, albeit partially, the prior programmed bit value of the twin-transistor memory cell from its prior programmed state, e.g., a logic 1 in this example, results in transistor thresholds within a small margin of each other. Then, as further depicted at 555, a re-balance operation is applied such that the threshold voltage of the True transistor is increased to a value that is equal to the (partially) recovered threshold voltage of the partially erased bit of the Complementary transistor. This is accomplished by writing an opposite value data, a partial logic 0 (small VT shift to compensate the partial erase 553) is written, e.g., by raising the threshold voltage value of the True transistor at 555 while the Complementary transistor threshold voltage value remains the same. This results in complete rebalancing prior to the subsequent write.

Finally, with the threshold voltages of each transistor now being equal to each other in value, the memory-cell may be easily programmed, i.e., re-written, with a new memory logic 0 value, as shown at 557, i.e., by raising the True transistor threshold voltage value relative to the threshold voltage value of the Complementary transistor which remains the same from its prior state.

Thus, in one aspect, the present system and method performs a twin-transistor memory cell Rebalance operation by combining partial rebalancing by simple erase operation and a complete rebalancing with additional write. In practice, this may first require the data stored in the memory cell (or array of multiple cells) to be read out, inverted and then rewritten into memory.

Figure 8:
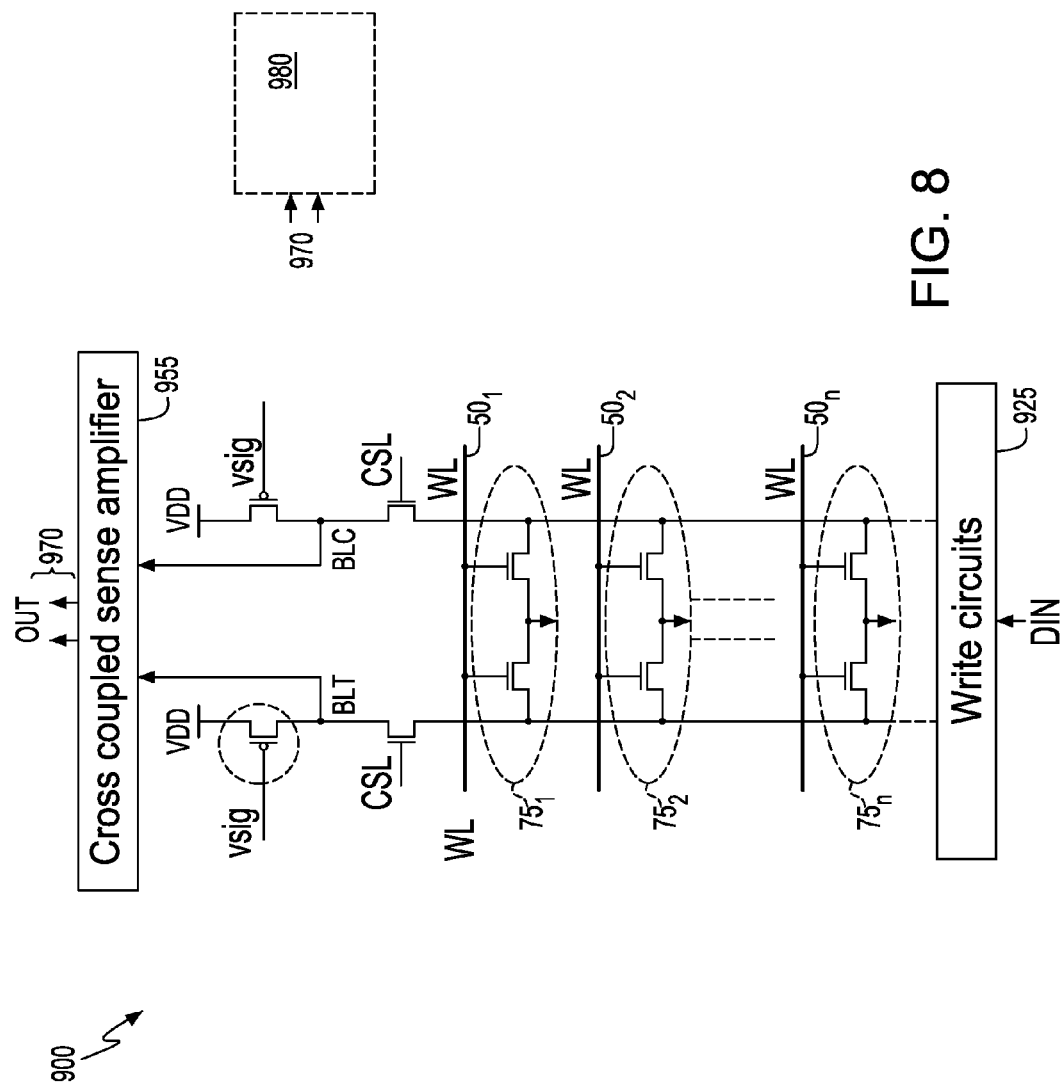
FIG. 8 shows a memory system that includes an array of memory cells 900 configured to perform memory cell rebalancing depicted in the embodiments herein.

FIG. 8 shows a configuration of a circuit depiction of a memory system 900 that includes an array of memory cells 75, each memory cell comprising a multi-time programmable twin-transistor memory cell $75_1, 75_2 \ldots 75_n$ each providing a differential signal output at Bitline True (BLT) and Bitline Complement (BLC) nodes. Each memory cell $75_i, 75_2 \ldots 75_n$ is shown selectable with a respective wordline WL $50_1, 50_2 \ldots 50_n$. As shown, the array 900 is coupled to a write circuit 925 for programming a threshold voltage (Vt) shift value into one or both twin-transistors of a selected memory cell 75. A sense amplifier circuit 955, e.g., a cross coupled sense amplifier, connects the array 900 for receiving the differential signal output signals through respective selectable (bitline) column select (CSL) gates and reading threshold voltage value outputs 970 of respective True-side transistor and Complement-side transistors at the BLT and BLC nodes.

This memory array 900 structure is configured to perform a twin-transistor memory cell Rebalance operation. In practice, this may first require the data stored in the memory cell (or array of multiple cells) to be read out by the sense amplifier circuit 955, inverted in voltage value, and then rewritten back into memory. This can be done for the entire memory at once, which would require a memory buffer 980 of equal size. After data has been inverted and rewritten back into the memory, the erase operation would follow.

In an alternate embodiment, this can be done for each memory-cell on a corresponding wordline $50_1, 50_2 \ldots 50_n$ at a time, which would require a much smaller buffer 980. Thus, after data has been inverted and rewritten back into the memory for all the wordlines, the erase operation would follow.

FIG. 9A shows a flow chart of a first embodiment of a method of operating a multi-time programmable memory cell, such as the multi-time programmable memory cells of FIG. 8 each having a series connection of a first (true) transistor and a second (complement) transistor. The operations are performed by the write circuit and sense amplifier/buffer memory circuits for the memory array 900 of FIG. 8. At a first step 1000, the system programs an initializing of the memory cell array. This may entail programming a parameter to an initial level in each of the selected memory cells to be written to. For example, voltage values may be applied to the twin-transistor memory cell to ensure each of the true transistor and complement transistors of the cell have a uniform threshold voltage, parameter e.g., 100 mV. Then, at 1010, the system performs programming bit values at selected memory cells of the memory array, e.g., by writing at select memory cell locations, using the write circuit, initial bit values to one or more select memory cells. This entails modifying the transistor parameter, e.g., applying of an induced voltage threshold shift voltage to one of the True of Complementary transistors of a cell to program a bit value therein. Then at 1015, these values may be used or read out and saved to another memory, e.g., memory buffer, for subsequent or concurrent use. In one embodiment, the next two steps are performed prior to writing new values at the select memory cell locations. At 1020, the system performs a rebalancing, using the write circuit, to modify a state of a parameter associated with one or more transistor devices of the memory cell. For example, when the parameter is the voltage threshold value, one or both of the True transistor or Complement transistors, may be modified by applying inverted or opposite bit logic values to the same selected written locations. Thus, for example, if a logic 1 bit value was previously written at the cell, the rebalancing will require the modification of True and Complement voltage threshold conditions as if a logic 0 value is being written. Likewise, for example, if a logic 0 bit value was previously written at the memory cell, the rebalancing will require the modification of True and Complement voltage threshold conditions as if a logic 1 value is being written at the select memory cell(s). Finally, as indicated at 1025, the system performs an erase cycle at each the rebalanced select memory cell, to further modify the transistor parameter of each True and Complement transistor and attempt to restore a more uniform condition for programming a bit value at the cell. For example, erasing may entail further modifying the True transistor and/or Complement transistor threshold voltages so that they are essentially uniform or within a small value of each other that is sufficient to ensure reading a next bit value written thereto. It is understood that the method steps of FIG. 9A may be repeated before programming a value to the memory cell location to ensure reproducibility and accuracy at each successive write cycle.

Example 1

Figures 9C, 10:
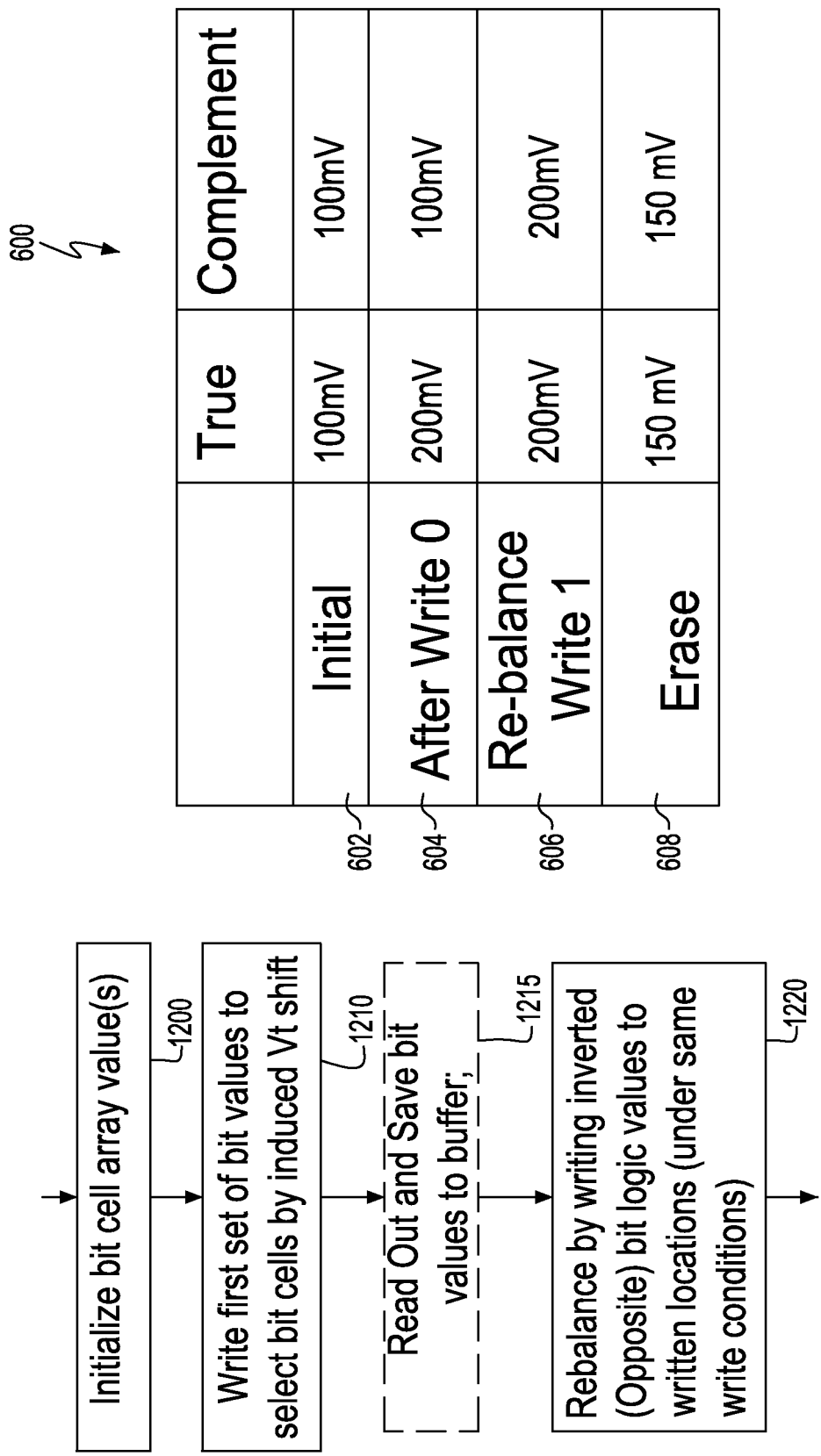
FIG. 9C shows a flow chart of a third embodiment of a method of operating a multi-time programmable memory cell consisting of a plurality of multi-time programmable memory cells of FIG. 8.
FIG. 10 shows a first example application of the method of FIG. 9A for programming parameter values for each True transistor and Complement transistor of a twin-transistor memory cell.

FIG. 10 shows a first example application of the method of FIG. 9A for programming parameter values (e.g., transistor threshold voltage states) 600 for each True transistor and Complement transistor of a twin-transistor memory bit cell such as shown in FIG. 1 that shows a result of implementing a rebalancing operation followed by a bit erase cycle. Initially, at 602, each of the True and Complement side transistors are at their initial threshold voltage states, e.g., 100 mV each. Then as shown at 604, a logic (0) zero is first written, e.g., by programming the "Complement"-side transistor to exhibit its initial (native) voltage threshold value, and by programming the "True"-side transistor to induce an additional threshold voltage value. FIG. 9 at 604 shows the resulting twin-transistor cell threshold voltage values "after Write 0" entry with the True transistor threshold voltage value at 200 mV and the Complement transistor threshold value at its initial (native) value of 100 mV. After reading out the data associated with the written bit cell values, a rebalancing operation is performed, at 606, such that the conditions associated with programming an inverted (opposite) logic value is written to the twin cell, i.e., writing a logic 1 value. In such a case, the "True"-side transistor is programmed to retain its raised voltage threshold value, and the "Complement"-side transistor is programmed to induce an additional threshold voltage value which raises its threshold value by an additional 100 mV to a value of 200 mV. Thus, as a result of the rebalancing, the True-side transistor and Complement-side transistor have equal values (e.g., 200 mV). A first erase cycle 608 may then be performed to attempt to reduce the threshold voltage values of each transistor to new complete rebalancing state value in partial erase condition. As shown at 608, both the threshold voltages of each True-side and Complement-side transistor is reduced, e.g., to 150 mV as a result of a partial erase cycle applied to each.

FIG. 9B shows a flow chart of a second embodiment of a method of operating a multi-time programmable memory cell, such as the multi-time programmable memory cells of FIG. 8. The operations are performed by the write circuit and sense amplifier/buffer memory circuits in the system shown in FIG. 8. At a first step 1100, the system programs an initializing of the memory cell array. This may entail programming a parameter to an initial level in each of the selected memory cells to be written to. For example, voltage values may be applied to the twin-transistor cell to ensure each of the true transistor and complement transistors of the cell have a uniform threshold voltage, parameter e.g., 100 mV. Then, at 1110, the system performs programming bit values at selected memory cells of the memory array, e.g., by writing at select memory cell locations, using the write circuit, initial bit values to one or more select memory cells. This entails modifying the transistor parameter, e.g., applying of an induced voltage threshold shift voltage, to one of the True of Complementary transistors of a cell to program a bit value therein. Then at 1115, these values may be used or read out and saved to another memory, e.g., memory buffer, for subsequent or concurrent use. In one embodiment, the next two steps are performed prior to writing new values at the select memory locations. At 1120, the system first performs an erase cycle at each the rebalanced select memory cell, to further modify the transistor parameter of each True and/or Complement transistor and attempt to restore a more uniform condition for programming a bit value at the cell. For example, erasing operation 1120 may entail further modifying the True transistor and/or Complement transistor threshold voltages so that they are partially rebalanced after the erase. Then, as indicated at 1125, the system performs the additional rebalancing write operation, using the write circuit, to modify a state of a parameter associated with one or more transistor devices of the memory cell. For example, when the parameter is the voltage threshold value, one or both of the True transistor or Complement transistors, may be modified by applying inverted or opposite bit logic values to the same selected written locations to compensate the imbalance due to partial rebalancing after the erase cycle 1120. Thus, for example, if a logic 1 bit value was previously written at the memory cell, the rebalancing will require the modification of True and Complement voltage threshold conditions as if a logic 0 value is being written. Likewise, for example, if a logic 0 bit value was previously written at the memory cell, the rebalancing will require the modification of True and Complement voltage threshold conditions as if a logic 1 value is being written at the select memory cell(s). It is understood that the method steps of FIG. 9B may be repeated before programming a value to the memory cell location to ensure reproducibility and accuracy at each successive write cycle.

Example 2

FIG. 11 shows an example application of the method of FIG. 9B for programming parameter values (transistor threshold voltage states) 700 for each True transistor and Complement transistor of a twin-transistor memory cell such as shown in FIG. 1 that shows a result of first implementing an erase cycle and subsequently applying a rebalancing operation. Initially, at 702, each of the True and Complement side transistors are at their initial threshold voltage states, e.g., 100 mV each. Then as shown at 704, a logic (1) one is first written, e.g., by programming the "True"-side transistor to exhibit its initial (native) voltage threshold value, and by programming the "Complement"-side transistor to induce an additional threshold voltage value. FIG. 11 at 704 shows the resulting twin-transistor cell threshold voltage values "after Write 1" entry with the Complement transistor threshold voltage value at 200 mV and the True-side transistor threshold value at its initial (native) value of 100 mV. Then, at 706, an applied bit-erase operation is performed in which an attempt is made to reduce the threshold voltage values of the Complementary transistor to its initial value. However, given a partial erase, 706 shows the resulting threshold voltage logic states where the "True"-side transistor is programmed to retain its threshold voltage, and the Complementary transistor threshold voltage is reduced only partially to a threshold voltage value of 150 mV (partial rebalancing). Then, a subsequent re-balance operation is performed at 708 which results in writing the inverted logic value, e.g., in this case, writing a logic 0. To write a logic 0, the True-side transistor threshold voltage value is raised relative to the voltage threshold value of the "Complement"-side transistor. This entails programmed the cell to induce an additional threshold voltage value which raises the threshold voltage of the True-side transistor by an additional 50 mV to a value of 150 mV which is equal to the Complementary transistor threshold voltage after the erase cycle. Thus, as a result of the rebalancing, the True-side transistor and Complement-side transistor have equal values (~150 mV) to ensure integrity for writing to and reading a next bit value at the memory cell location.

FIG. 9C shows a flow chart of a third embodiment of a method of operating a multi-time programmable memory cell, such as the multi-time programmable memory cells of FIG. 8. The operations are performed by the write circuit and sense amplifier/buffer memory circuits in the system shown in FIG. 8. At a first step 1200, the system programs an initializing of the memory cell array. This may entail programming a parameter to an initial level in each of the selected memory cells to be written to. For example, voltage values may be applied to the twin-transistor cell to ensure each of the true transistor and complement transistors of the cell have a uniform threshold voltage, parameter e.g., 100 mV. Then, at 1210, the system performs programming bit values at selected memory cells of the memory array, e.g., by writing at select memory cell locations, using the write circuit, initial bit values to one or more select memory cells. This entails modifying the transistor parameter, e.g., applying of an induced voltage threshold shift voltage, to one of the True or Complementary transistors of a cell to program a bit value therein. Then at 1215, these values may be used or read out and saved to another memory, e.g., memory buffer, for subsequent or concurrent use. In one embodiment, as indicated at 1220, the system then performs the rebalancing, using the write circuit, to modify a state of a parameter associated with one or more transistor devices of the memory cell. For example, when the parameter is the voltage threshold value, one or both of the True transistor or Complement transistors, may be modified by applying inverted or opposite bit logic values to the same selected written locations. Thus, for example, if a logic 1 bit value was previously written at the cell, the rebalancing will require the modification of True and Complement voltage threshold conditions as if a logic 0 value is being written. Likewise, for example, if a logic 0 bit value was previously written at the memory cell, the rebalancing will require the modification of True and Complement voltage threshold conditions as if a logic 1 value is being written at the select memory cell(s). It is understood that the method steps of FIG. 9C may be repeated before programming a value to the memory cell location to ensure reproducibility and accuracy at each successive write cycle.

Example 3

FIG. 12 shows a third example of programmed parameter values (transistor threshold voltage states) 700 for each True transistor and Complement transistor of a twin-transistor memory cell such as shown in FIG. 1 that shows a result of implementing a rebalancing operation without an erase cycle. Initially, at 802, each of the True and Complement side transistors are at their initial threshold voltage states, e.g., 100 mV each. Then as shown at 804, a logic (1) one is first written, e.g., by programming the "True"-side transistor to retain its initial (native) voltage threshold value, and by programming the "Complement"-side transistor to induce an additional threshold voltage value. FIG. 11 at 804 shows the resulting twin-transistor cell threshold voltage values "after Write 1" entry with the Complement transistor threshold voltage value at 200 mV and the True-side transistor threshold value at its initial (native) value of 100 mV. Then, at 806, a subsequent re-balance operation is performed which results in writing the inverted logic value, e.g., in this case, writing a logic 0. To write a logic 0, the True-side transistor threshold voltage value is raised relative to the voltage threshold value of the "Complement"-side transistor. This entails programmed the cell to induce an additional threshold voltage value which raises the threshold voltage of the True-side transistor by an additional 100 mV to a value of 200 mV which is equal to the current Complementary transistor threshold voltage. Thus, as a result of the rebalancing, the True-side transistor and Complement-side transistor have equal values (~200 mV).

The present system and methods use rebalancing to enable multiple write capability where the mechanism for data storage permits a continuous variation of the property of the device over a broad range but an erase function is either non-existent or not very effective. It should be understood that the memory cell rebalancing methods as employed in the flow charts of FIGS. 9A-9C may be operated with any Multi-Time-Programmable-Memory (MTPM) memory system and associated circuit structures that decode, electronically drive, and store a bit value as a modified circuit parameter, e.g., a voltage threshold shift of a memory cell transistor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of operating a multi-time programmable memory cell, said multi-time programmable memory cell having a series connection of a first transistor and a second transistor, said method comprising:

writing, using a write circuit at select memory cell locations, initial bit values to one or more select memory cells by changing a threshold voltage state of one of said first and said second transistor relative to the other of said first and said second transistor to create a different state in a selected cell;

rebalancing, using said write circuit, the threshold voltage state associated with one or more said first transistor or second transistor by changing the threshold voltage state of one of said first or said second transistor to set equal both threshold voltage states at said select memory cell, and erasing, at each said rebalanced select memory cell, said written initial bit value.

2. The method of claim 1, further comprising:
repeating the rebalancing and select memory cell erasing prior to a writing of a next bit value at said select memory cell.

3. The method of claim 1, wherein said erasing comprises:
performing said erasing of memory cell values prior to said rebalancing to restore a memory cell state to an initial condition.

4. The method of claim 1, further comprising:
initializing a threshold voltage state associated with each of the first transistor or second transistor at said select memory cell location to a set value corresponding to an initial state, prior to writing said initial bit value.

5. The method of claim 4, wherein said erasing results in partially restoring or fully restoring said threshold voltage state associated with one or more of said first transistor and/or second transistor associated with each said select memory cell location to a respective initial state.

6. The method of claim 1, wherein prior to said rebalancing, said method further comprising:
reading, by a sense circuit, data stored according to each said written bit value at each select memory cell locations, for storage at a further memory device, said reading comprising one or more of:
reading, using said sensing circuit, all bit values of an entire memory at once into a memory location at a further memory device; or,
reading, using said sensing circuit, each said written selected memory cell that are connected to a single wordline at a time, for all wordlines, into a buffer location at said further memory device.

7. The method of claim 4, wherein the rebalancing of the threshold voltage state associated with one or more transistor devices of a differential transistor pair, comprises:
modifying, to an opposite or inverted value, the threshold voltage state of one of: said first transistor device or second transistor device, at the selected memory cell.

8. The method of claim 1, wherein the writing of initial bit values to said one or more select memory cells further comprises:
inducing an additional threshold shift voltage to increase a voltage threshold at one of: a first transistor device, or second transistor device, at the selected memory cell.

9. The method of claim 1, wherein the rebalancing of said initial bit values written to said one or more select memory cells further comprises:
inducing an additional threshold shift voltage that is opposite of a previous written bit value at one of: said first transistor device or second transistor device, at the selected memory cell.

10. A system of operating a multi-time programmable memory cell, said multi-time programmable memory cell having a series connection of a first transistor and a second transistor, said system comprising:
a memory device having memory cells, each memory cell comprising a differential transistor pair;
a write circuit configured to write, by changing a threshold voltage state of one of said first and said second transistor relative to the other of said first and said second transistor to create a different state in a differential transistor pair of a selected memory cell, an initial bit value;
said write circuit further configured to rebalance the threshold voltage state associated with one or more transistor devices of the differential transistor pair by changing the threshold voltage state of one of said first or said second transistor to set equal both threshold voltage transistor states at said, and
said write circuit further configured to erase, at each said rebalanced select memory cell, said written initial bit value.

11. The system of claim 10, further comprising:
wherein said writing circuit is configured to repeat the rebalancing and select memory cell erasing prior to a writing of a next bit value said select memory cell.

12. The system of claim 10, wherein said write circuit performs said erasing of memory cell values prior to said rebalancing to restore a memory cell state to an initial condition.

13. The system of claim 10, wherein said write circuit is further configured to:
initialize a threshold voltage state associated with each of a first transistor or second transistor at said select memory cell location to a set value, prior to writing said initial bit value.

14. The system of claim 13, wherein said erasing results in partial restoration or full restoration of said threshold voltage state associated with one or more of said first transistor and/or second transistor associated with each said select memory cell location to a respective initial state.

15. The system of claim 10, further comprising:
a further memory storage device;
a sensing circuit for reading data out of said memory cell memory device, for storage in said further memory storage device;
wherein prior to said rebalancing, said write circuit method further comprising:
reading, by the sensing circuit, data stored according to each said written bit value at each select memory cell locations, for storage at said further memory device, wherein
all bit values of an entire memory are read at once for storage into a memory location at the further memory device; or,
each said written selected memory cell that are connected to a single wordline are read at a time, for all wordlines, into a memory location at said further memory device.

16. The system of claim 13, wherein to rebalance the threshold voltage state associated with one or more transistor devices of the differential transistor pair, said write circuit is further configured to:
modify, to an opposite or inverted value, a threshold voltage state of the associated one of: said first transistor device or second transistor device, at the selected memory cell.

17. The system of claim 13, wherein a programmed bit value of a selected memory cell is represented by a voltage threshold shift in one of said first transistor or second transistor.

18. The system of claim 17, wherein to write an initial bit value to said one or more select memory cells, said write circuit is further configured to:
induce an additional threshold shift voltage to increase a voltage threshold at one of: a first transistor device or second transistor device, at the selected memory cell.

19. The system of claim 17, wherein to rebalance said initial bit values written to said one or more select memory cells, said write circuit is further configured to:
induce an additional threshold shift voltage that is opposite of a previous written bit value at one of: said first transistor device or second transistor device, at the selected memory cell.

* * * * *